(12) United States Patent
Paillet et al.

(10) Patent No.: US 7,167,397 B2
(45) Date of Patent: Jan. 23, 2007

(54) APPARATUS AND METHOD FOR PROGRAMMING A MEMORY ARRAY

(75) Inventors: Fabrice Paillet, Hillsboro, OR (US); Ali Keshavarzi, Portland, OR (US); Muhammad M. Khellah, Tigard, OR (US); Dinesh Somasekhar, Portland, OR (US); Yibin Ye, Portland, OR (US); Stephen H. Tang, Pleasanton, CA (US); Mohsen Alavi, Portland, OR (US); Vivek K. De, Beaverton, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 11/158,518

(22) Filed: Jun. 21, 2005

(65) Prior Publication Data

US 2006/0285393 A1    Dec. 21, 2006

(51) Int. Cl.
*G11C 16/04* (2006.01)

(52) U.S. Cl. .......................... 365/185.28; 365/185.23; 365/225.7

(58) Field of Classification Search ................ 365/200, 365/225.7, 185.09, 230.06, 185.28, 185.23
See application file for complete search history.

(56) References Cited

U.S. PATENT DOCUMENTS

| | | | | |
|---|---|---|---|---|
| 5,508,959 A | * | 4/1996 | Lee et al. ................ | 365/185.3 |
| 6,034,882 A | * | 3/2000 | Johnson et al. ............ | 365/103 |
| 6,515,344 B1 | * | 2/2003 | Wollesen ................... | 257/530 |
| 6,686,791 B2 | * | 2/2004 | Zheng et al. ............... | 327/525 |
| 7,102,951 B2 | * | 9/2006 | Paillet et al. ............ | 365/225.7 |
| 2006/0140030 A1 | * | 6/2006 | Bedarida et al. ........... | 365/201 |

* cited by examiner

*Primary Examiner*—Gene N. Auduong
(74) *Attorney, Agent, or Firm*—Schwegman, Lundberg, Woessner & Kluth, P.A.

(57) ABSTRACT

A method of programming a memory array is provided, including accessing a plurality of word lines of the memory array by providing a plurality of voltage steps sequentially after one another to the respective word lines, and accessing a plurality of bit lines of the memory array each time that a respective word line is accessed, to program a plurality of devices corresponding to individual word and bit lines that are simultaneously accessed, each device being programmed by breaking a dielectric layer of the device, accessing of the bit lines being sequenced such that only a single one of the devices is programmed at a time.

15 Claims, 5 Drawing Sheets

APPARATUS AND METHOD FOR PROGRAMMING A MEMORY ARRAY

BACKGROUND OF THE INVENTION

1). Field of the Invention

Embodiments of this invention relate to a method and apparatus for programming a memory array.

2). Discussion of Related Art

One-time programmable ("OTP") cells are used in integrated circuit ("IC") devices for a variety of applications including OTP memory applications. They may be used as a single memory cell or in arrays of memory cells to provide unique die/chip IDs and to set operating parameters such as clock multipliers and voltage levels for devices such as microprocessors. They may also be used to configure, customize, and repair a chip after testing (e.g., to repair a processor chip's cache memory array). OTP cells are typically implemented using charge storage, fuse, or anti-fuse approaches. Charge storage approaches have typically involved defining a bit value based on charge stored on an insulated metal oxide semiconductor ("MOS") type gate structure. Such charge storage approaches, however, are not practicable with current and future deep sub-micron technologies that feature very thin gate oxide because of the high gate leakage current that prevents a long retention time of the information.

On the other hand, fuse and anti-fuse solutions are more reliable with such technologies. A fuse (or anti-fuse) link can be used to indicate a logic level (e.g., a High or Low level), depending on whether or not it is "blown" or left in its normal state. The natural state of a fuse is closed, but when it is blown (or burned), its resistance is increased to an open state (relative to its normal closed state). In contrast, an anti-fuse is blown closed, with its natural state being an open circuit (relative to its normal, open state). A fuse or anti-fuse can thus be used to establish a logic level whose value depends upon whether it is blown or left in its normal state.

As silicon manufacturing technologies scale, the thickness of the oxide layer isolating the gate of MOS transistors becomes thinner. As a result, it has become feasible to break down this oxide by applying a sufficiently high voltage (e.g., 3 V or higher) across the oxide layer. Accordingly, oxide layers are now being used to implement anti-fuse elements. They are naturally open, but when broken down, become closed. (For examples of oxide layers used as anti-fuse elements, see U.S. Pat. No. 6,686,791 to Zheng, et al., and U.S. Pat. No. 6,515,344 to Wollesen.)

A current flows through an element, or bit, that is being programmed. Should multiple elements be programmed at the same moment in time, the total amount of current that would flow would equal the current flowing through one of the elements multiplied by the number of elements that are being programmed. The voltage source has to be manufactured sufficiently large in order to handle a large current when multiple elements are programmed at the same time.

BRIEF DESCRIPTION OF THE DRAWINGS

The invention is described by way of example with reference to the accompanying drawings, wherein.

DETAILED DESCRIPTION OF THE INVENTION

Figure 1:
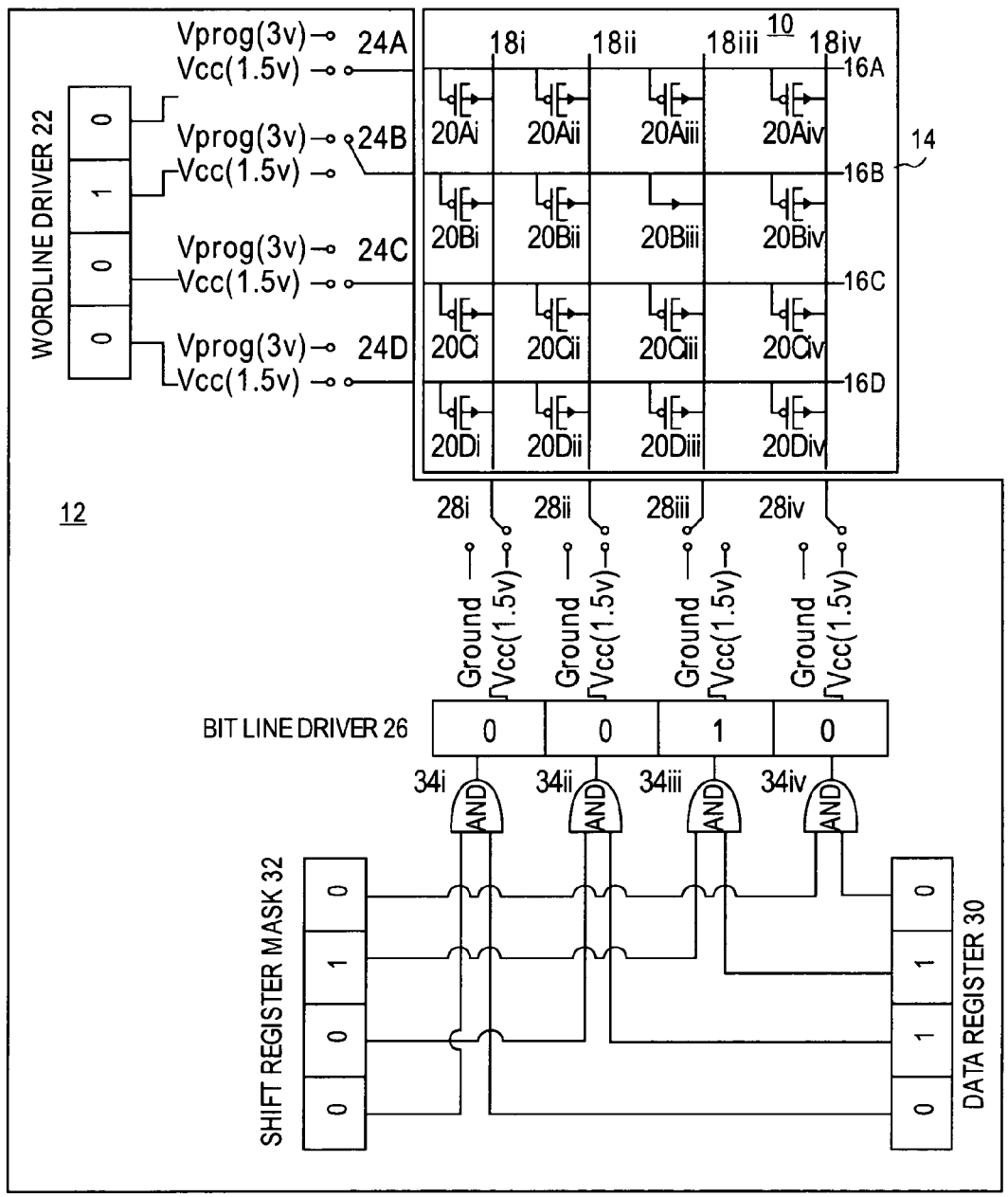
FIG. 1 is a diagram illustrating a memory array and an apparatus that is used for programming the memory array, according to an embodiment of the invention.

FIG. 1 of the accompanying drawings illustrates a memory array 10 and an apparatus 12 that is used to program the memory array 10, according to an embodiment of the invention.

The memory array 10 has a semiconductor substrate 14 and a plurality of components formed in and on the substrate 14, including a plurality of word lines 16, a plurality of bit lines 18, and a plurality of bits 20. The word lines 16 extend in an x-direction, and the bit lines 18 extend in a y-direction across the substrate 14. Each bit 20 is connected between one of the word lines 16 and one of the bit lines 18 near an intersection of the respective word line 16 and bit line 18. The bits 20 thus form an x-y array across the substrate 14.

The bits 20 are initially PMOS transistors with a gate of the PMOS transistor to connect it to the word line 16, and both the source and the drain of the PMOS transistor connected to a bit line 18. A voltage of at least three volts applied to the gate of the PMOS transistor can permanently break a dielectric layer of the PMOS transistor. The bit can then carry current in one direction only, essentially turning the PMOS transistor into a diode.

The apparatus 12 includes a word line driver 22, a plurality of word line switches 24, a bit line driver 26, a plurality of bit line switches 28, a data register 30, a shift register mask 32, and a plurality of AND gates 34.

The memory array 10 is temporarily connected to the apparatus 12 so that each one of the word lines 16 is connected to a respective one of the word line switches 24, and each one of the bit lines 18 is connected to a respective one of the bit line switches 28. Each word line switch 24 can switch between regular power, or Vcc, of 1.5 V, and a higher programming voltage, or Vprog, of 3 V. The bit line switches 28 can switch between ground and Vcc of 1.5 V. Under normal, non-programming conditions, the word line switches 24 and bit line switches 28 are all at Vcc 1.5 V. One of the bits 20 can be programmed by switching one of the word line switches 24 to Vprog of 3 V, and one of the bit line switches 28 to ground. The voltage differential of 3 V that is created is sufficient to break the dielectric layer of a PMOS transistor.

What should be noted is that a current flows only through a bit 20 that is being programmed. If two of the bits 20 are simultaneously programmed, the current would be twice as much as when one of the bits 20 is programmed. An increase in current will require a larger Vprog power source. As will be discussed, it is thus required that as few as possible, preferably only a single one, of the bits 20 be programmed at any particular moment in time.

The following table provides a listing of how the bits 20 are programmed:

| Word Lines | Bit Lines (Word to be written) | Shift Register Mask | Bit Written |
|---|---|---|---|
| 0 0 0 1 | 1 1 0 1 | 0 0 0 1 | 0 0 0 1 |
| 0 0 0 1 | 1 1 0 1 | 0 0 1 0 | 0 0 0 0 |
| 0 0 0 1 | 1 1 0 1 | 0 1 0 0 | 0 1 0 0 |
| 0 0 0 1 | 1 1 0 1 | 1 0 0 0 | 1 0 0 0 |
| 0 0 1 0 | 0 1 1 0 | 0 0 0 1 | 0 0 0 0 |
| 0 0 1 0 | 0 1 1 0 | 0 0 1 0 | 0 0 1 0 |
| 0 0 1 0 | 0 1 1 0 | 0 1 0 0 | 0 1 0 0 |
| 0 0 1 0 | 0 1 1 0 | 1 0 0 0 | 0 0 0 0 |
| 0 1 0 0 | 1 0 1 1 | 0 0 0 1 | 0 0 0 1 |
| 0 1 0 0 | 1 0 1 1 | 0 0 1 0 | 0 0 1 0 |
| 0 1 0 0 | 1 0 1 1 | 0 1 0 0 | 0 0 0 0 |
| 0 1 0 0 | 1 0 1 1 | 1 0 0 0 | 1 0 0 0 |
| 1 0 0 0 | 1 0 0 1 | 0 0 0 1 | 0 0 0 1 |
| 1 0 0 0 | 1 0 0 1 | 0 0 1 0 | 0 0 0 0 |
| 1 0 0 0 | 1 0 0 1 | 0 1 0 0 | 0 0 0 0 |
| 1 0 0 0 | 1 0 0 1 | 1 0 0 0 | 1 0 0 0 |

The data is sequenced row after row in the table. FIG. 1 illustrates the table at a particular moment in time corresponding to the sixth row in the table.

Only a single bit of the word line driver 22 is set to "one" at a particular moment in time. The bit of the word line driver 22 that is set to "one" switches one of the word line switches 24B (in the moment in time of FIG. 1) to Vprog of 3 V, while the other word line switches 24A, 24C, and 24D are at Vcc of 1.5 V. One of the word lines 16B is then at 3 V while the other word lines 16A, 16C, and 16D are at 1.5 V. Only the bits 20Bi, 20Bii, 20Biii, and 20Biv connected to the word line 16B can be programmed when only the word line 16B is at 3 V.

After the required bits connected to the word line 16B are programmed the one of the word line driver 22 is sequenced so that the word line 16C is at 16 V, and the word lines 16A, 16B, and 16D are at 1.5 V. A 1.5 V voltage step is thus provided to each word line 16A, 16C, and 16D.

The shift register mask 32 ensures that only a single bit 20Biii of the bits 20Bi, 20Bii, 20Biii, and 20Biv connected to word line 16B is programmed at a particular moment in time. Only a single one of the bits of the shift register mask 32 is set to "one" at a particular moment in time. Each one of the bits of the shift register mask 32 is connected through a respective one of the AND gates 34i, 34ii, and 34iii to respective bits of the bit line driver 26. Only one bit of the bit line driver 26 can thus be set to "one" at a particular moment in time.

The data register 30 holds a word to be programmed. The word to be programmed may include multiple bits that are set to "one." Each one of the bits of the data register 30 is connected to a respective one of the AND gates 34i, 34ii, 34iii, and 34iv. The bit of the bit line driver 26 that is set to "one" switches one of the bit line switches 28iii to ground, while the other bit line switches 28i, 28ii, and 28iv are connected to Vcc of 1.5 V. The bit line 18iii is thus at ground, while the bit lines 18i, 18ii, and 18iv are at 1.5 V. The voltage differential between the word line 16B and the bit line 28iii is sufficient to break the dielectric layer of, and thus program the bit 20Biii. The particular bit of the shift register mask 32 that is set to "one" is sequenced through the shift register mask 32 for every word that has to be programmed, i.e., the "one" of the shift register mask 32 is sequenced through the shift register mask while the "one" of the word line driver 22 remains unchanged. It can thus be seen that the shift register mask 32 ensures that no more than a single bit of the memory array 10 is programmed at a particular moment in time. At the particular moment in time of FIG. 1, two of the bits 20Bii and 20Biii will be programmed, if it were not for the shift register mask 32. The shift register mask 32 thus reduces the current that is required and the size of the power source for Vprog.

Figure 2:
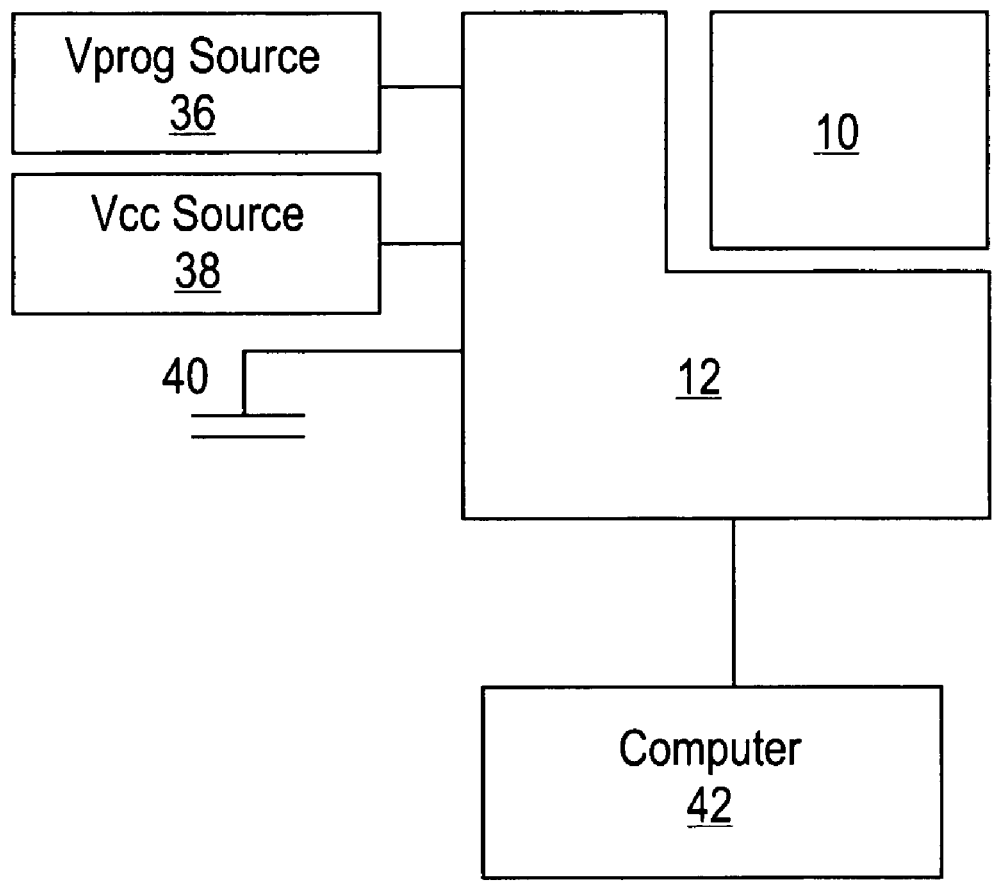
FIG. 2 is a block diagram of the memory array and the apparatus, further illustrating power sources, ground, and a computer that are connected to the apparatus.

FIG. 2 illustrates additional components that are required to operate the apparatus 12, including a Vprog source 36, a Vcc source 38, ground 40, and a computer 42. The Vprog source 36 is connected to the word line switches 24 of FIG. 1. The Vcc source 38 is connected to the word line switches 24 and the bit line switches 28. Ground 40 is connected to the bit line switches 28. The computer 42 is connected to the word line driver 22, the shift register mask 32, and the data register 30. A series of programming instructions is loaded in a memory of the computer 42, and are used to provide instructions to the word line driver 22, shift register mask 32, and data register 30, according to the table.

Figure 3:
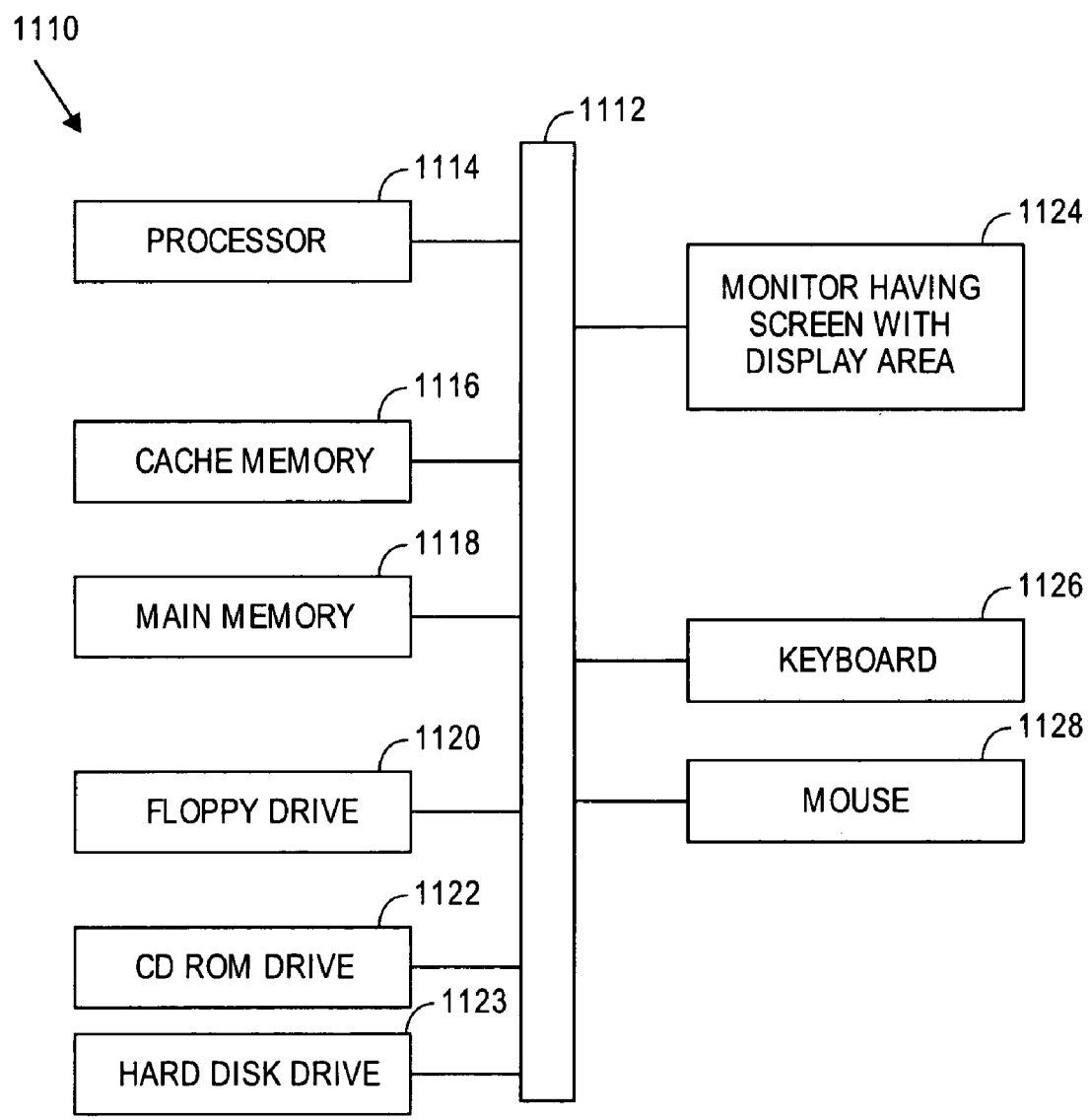
FIG. 3 is a block diagram of a computer system that may include a memory array such as the memory array that is programmed in FIG. 1.

FIG. 3 of the accompanying drawings illustrates further components of a computer system 1110. The computer system 1110 further includes a bus 1112 having connected thereto the microelectronic die 1114, cache memory 1116, main memory 1118, a floppy drive 1120, a compact disk read-only-memory (CD-ROM) drive 1122, a hard disk drive 1123, a monitor 1124 having a screen with a display area, a keyboard 1126, and a mouse 1128. The microelectronic die 1114 may, for example, include an OTP memory array such as in FIG. 1. A list of instructions in the form of a program can be stored on, for example, a compact disk and be loaded in the CD-ROM drive 1122. The instructions of the program can be loaded into the cache memory 1116 and the main memory 1118, while more of the instructions may reside on the compact disk and on the hard disk of the hard drive. The floppy drive 1120 or the hard disk drive 1123 may be used instead of the CD-ROM drive 1122 to load instructions into the computer system 1110. The instructions can be read by the microelectronic die 1114 in a logical manner, which ensures proper execution of the program. A user may interact, utilizing the mouse 1128 or the keyboard 1126. A respective signal can be generated by the mouse 1128 or the keyboard 1126. The signal is sent through the bus 1112 and ultimately to the microelectronic die 1114, which responds to the signal to modify an execution of the program. Execution of the program by the microelectronic die 1114 results in control of how information stored in the main memory 1118, the cache memory 1116, the hard disk drive 1123, or the CD-ROM drive 1122 is displayed on the display area of the monitor 1124.

Figure 4:
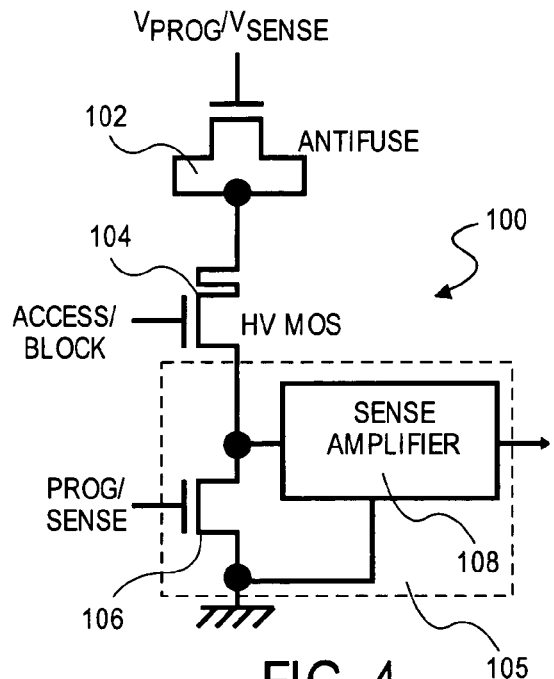
FIG. 4 illustrates an OTP circuit utilizing an NMOS antifuse device according to some embodiments of the present invention.
Figure 5:
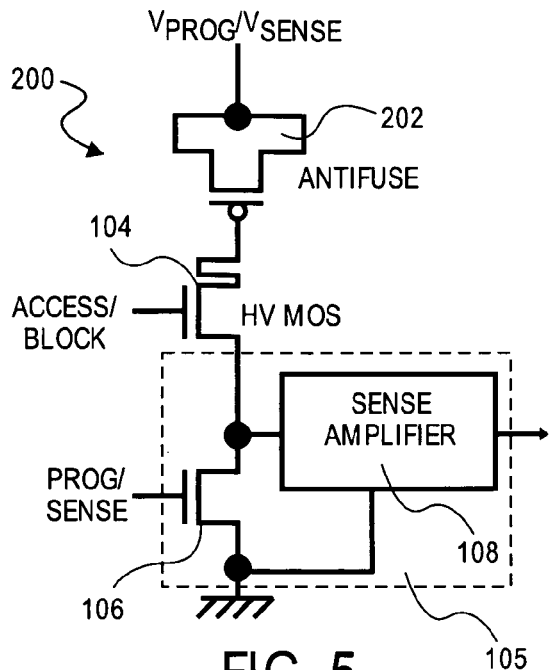
FIG. 5 illustrates one embodiment of an OTP circuit utilizing a PMOS antifuse device.

FIGS. 4 and 5 show antifuse cell circuits 100 and 200, respectively, that may be programmed according to the foregoing description. (The circuits 100 and 200 are the same except that an NMOS antifuse element 102 is used in FIG. 4, while a PMOS antifuse element 202 is used in the circuit of FIG. 5. Because the circuits are the same (except for their particular antifuse element) only the circuit with reference to FIG. 4 will be described.

With reference to FIG. 4, antifuse cell 100 comprises an NMOS antifuse element 102, a high voltage device 104, and a sense circuit 105 formed from a program/sense NMOS transistor 106 and a sense amplifier 108. The MOS antifuse device 102 has two terminals, one coupled to a voltage supply, $V_{SENSE}/V_{PROG}$ terminal, and the other coupled to the high voltage device 104. In the depicted embodiment, the antifuse cell is used in a MOS logic circuit operating with a Vcc of about 1.2 V. Accordingly, the voltage supply terminal ($V_{SENSE}/V_{PROG}$) is set at about 1.2 V during sensing (reading) and in excess of about 3 V during programming. (It should be recognized that the circuits and concepts discussed herein are applicable in systems having other supply, sensing, and/or programming voltages.) The high voltage device 104 is positioned between the antifuse element 102 and the sense circuit 105 to protectively shield it from the high programming voltage. The depicted program/sense transistor 106 is an NMOS transistor with the sense amplifier 108 coupled at its drain.

An ACCESS/BLOCK signal is applied at the input of the high voltage device 104 to controllably couple the antifuse element 102 to the sense circuit 105. In one embodiment, the ACCESS/BLOCK signal is at a level (e.g., Vcc) sufficient to couple the antifuse element 102 to the sense circuit 105 during both programming and sensing operations. With the depicted embodiment, a vertical drain NMOS ("VDN-MOS") transistor is used to implement the high voltage device 104 and thus, the ACCESS/BLOCK signal is applied to the gate of the VDNMOS transistor 104. A VDNMOS transistor (described in greater detail below) is an asymmetrical transistor that is able to accept a higher than normal maximum operating voltage (e.g., in excess of 1.2 V) at its drain terminal. Thus, it is able to accept the high programming voltage applied at its drain if (and when) the antifuse element 102 is blown. With its drain-to-source resistance made sufficiently high, relative to that of the program/sense transistor 106, a sufficient portion of the program voltage is dropped across it thereby preventing the program/sense transistor 106 from being subjected to a detrimental portion of the program voltage. In addition, because the ACCESS/BLOCK signal does not exceed Vcc, the VDNMOS transistor 104 cannot turn on if a voltage equal to or higher than Vcc is imparted at its source, thereby preventing higher than Vcc voltages from reaching the program/sense transistor 106 and sense amplifier 108. (It should be appreciated that the high voltage device 104 may be formed from any suitable device or device combination for coupling the antifuse element to the sense circuit including but not limited to VDNMOS transistors or any other high voltage transistor such as, for example, a vertical source drain MOS transistor or a vertical source PMOS transistor, with its drain and source terminals reversed from those of the depicted VDNMOS device 104.)

A PROG/SENSE control signal is input at the gate of the program/sense transistor 106 to turn it on when the antifuse is to be programmed and to turn it off during sensing when the antifuse is to be sensed. During programming when the high $V_{PROG}$ voltage is applied at the voltage supply terminal, both the high voltage device and program/sense transistor 106 are "on" thereby causing the high program voltage to be applied across the antifuse element 102, which is initially open. A current path is provided from the antifuse element 102 to ground through the high voltage device 104 and program/sense transistor 106. Thus, as the antifuse element breaks down, current is tunneled through it until its resistance is sufficiently reduced (i.e., until it is "blown"). During sensing, on the other hand, the lower $V_{SENSE}$ voltage is applied at the antifuse element voltage supply terminal, and the program/sense transistor 106 is turned off, which forces current passing through the antifuse element (if it has been blown) to flow substantially into the sense amplifier 108.

Figure 8:
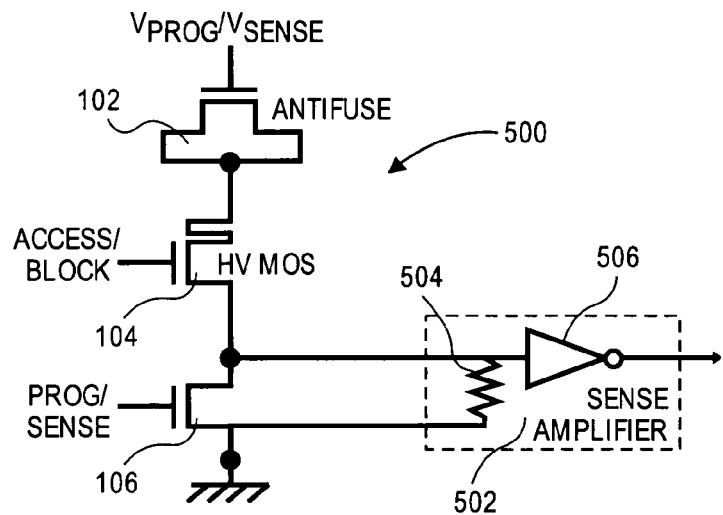
FIG. 8 illustrates the OTP circuit of FIG. 1 utilizing a sense amplifier circuit according to one embodiment of the present invention.

The sense amplifier 108 serves to effectively measure the antifuse element current and generate a signal indicative of its programmed state, e.g., whether it was left open or blown closed. With additional reference to FIG. 8, one embodiment of a sense amplifier circuit 502 for implementing the sense amplifier 108 is depicted in an antifuse cell circuit 500. The sense amplifier 502 includes a resistor 504 coupled to the high voltage device 104 and an inverter 506 coupled with its input coupled to the node of the resistor common to the high voltage device 104. Resistor 504, which may be formed from a conventional resistor-coupled MOS transistor, is designed to have a resistance that produces, during sensing, a voltage at the inverter 506 input that is sufficiently high to assert the inverter when the antifuse has been blown and sufficiently low to negate the inverter when the antifuse has been left open. The inverter 506 can be implemented with any suitable device (or device combination) including, for example, a conventional inverter formed from PMOS and NMOS transistors coupled with their gates and drains coupled together.

It should be appreciated that even though a current measuring sense amplifier is shown and described, any other suitable sensing approach could be used. For example, instead of being turned off during sensing, the program/sense transistor could be maintained on (for both sensing and programming) and designed to produce a voltage at its drain to be directly measured by the sense amplifier 108. It is thus contemplated that a variety of sense circuit 105 configurations could be employed with different embodiments of the present invention.

Figure 6:
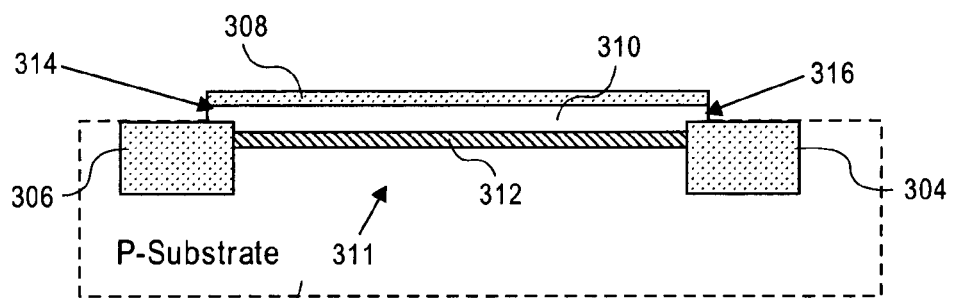
FIG. 6 illustrates a cross-sectional view of one embodiment of an NMOS transistor suitable for use as an antifuse element.

With reference to FIG. 6, a cross-sectional view of an NMOS transistor 300 is depicted. It will be discussed in connection with its use as an antifuse element such as the NMOS element 102 of FIG. 4. NMOS transistor 300 is formed on a P-type substrate 302. (As used herein, the term "substrate" denotes a semiconductor substrate or an epitaxial layer formed on the semiconductor substrate.) It comprises a drain 304 and a source 306 formed from doped, N+ regions deposited on the substrate 302, along with a gate 308 (such as a polysilicon gate) formed atop an oxide layer 310 positioned over a channel region 311 spaced between the drain 304 and source 306. At one end 314, the oxide layer partially overlaps the source 306, while at its other end 316, the oxide layer partially overlaps the drain 304. In the depicted embodiment, the oxide layer is generally between 30 and 70 Ang. thick, but as indicated in the drawing, is thinner at its edges 314, 316 where it overlaps the source and drain, respectively. When a positive voltage (relative to the source 306) is applied at the gate 308, a charge carrying inversion layer 312 is formed within the channel 311. With the drain/source coupled together, a MOS capacitor is thus formed with the gate 308 serving as one electrode; the drain/source (and inversion layer when the device is biased "on") serving as the other electrode; and the oxide layer serving as the capacitor dielectric. The antifuse elements (102, 202) are formed in this way. Ideally, with either device, the transistor is configured to be turned on (e.g., biased in a pinch-off mode), which makes it easier to drive sufficient current through the gate oxide during programming with a lower programming voltage. (It is believed that this is so because it reduces the diode effect needed to be overcome, and it provides for a larger electrode surface thereby reducing the lengths of the overall tunneled pathways formed in the oxide.) Accordingly, as depicted in FIGS. 4 and 5, the NMOS device (102) is arranged with its gate coupled to the supply voltage terminal, while the PMOS is arranged with its gate coupled to the high voltage device and its source/drain terminal coupled to the voltage supply.

The anti-fuse element is programmed by applying a programming voltage (e.g., 3 V) at the gate and source/drain terminals (across the oxide layer 310) to break it down, thereby forming one or more permanent charge carrier tunnels through the oxide layer to form a conductive path through it. One advantage of using an oxide as an antifuse element in this way is that the breakdown process is cumulative. That is, if the device is not sufficiently broken down (low enough resistance) after initial programming, it can be broken down further until a desired conductivity across the oxide layer is attained. It has been observed that with oxide antifuse elements, a difference in resistivity of a broken versus an unbroken antifuse element can be achieved in the range of three to four orders of magnitude, which is sufficient to achieve a robust sensing scheme.

Different current and voltage levels may be required for different oxide materials and dimensions but with typical transistor configurations, passing a current of about 1 milliamp between the gate and source/drain will usually suffice to breakdown the gate oxide for a desired OTP antifuse application. (This will vary depending on the amount of time that the current is passed through the oxide layer, the particular type of oxide or other dielectric material used, the particular dimensions of the gate oxide material, and the desired decrease in oxide layer resistance. For example, it is believed that the oxide breakdown normally occurs at the overlap edges of the oxide 314, 316, where it is at its thinnest. Thus, the oxide layer dimensions should be considered; an oxide layer with "thin" edges may "break" more easily, i.e., with less voltage and/or current or for a smaller programming time duration. On the other hand, it may not be as durable in maintaining its programmed resistance.)

It should be appreciated that any suitable oxide (or gate dielectric) material could be used to implement an antifuse element. While $SiO_2$ is primarily used as a gate dielectric for most IC applications, other dielectric materials could also be used to form antifuse elements. For example, as semiconductor devices scale, better dielectric materials such as Al2O3, ZrO and TiO may be used in the future due to their higher permittivities, which allows them to provide greater field strength with thicker dimensions, thereby making them less susceptible to undesired oxide breakdown. Such gate dielectric materials could be used to form antifuse elements depending upon their breakdown characteristics. Likewise, while a MOS capacitor is used in the depicted embodiment as the antifuse element, any other suitable antifuse structure such as an oxide layer formed between conductor terminals and made specifically for the purpose of implementing an antifuse element could also be used; however, it may be simpler and more efficient from a production standpoint to use available transistor structures.

Figure 7:
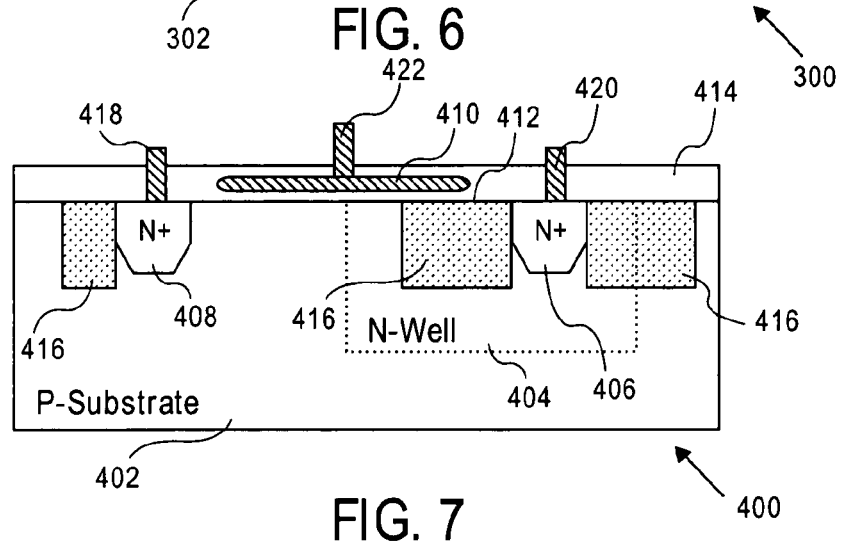
FIG. 7 illustrates a cross-sectional view of one embodiment of a vertical-drain NMOS (VDNMOS) transistor suitable for use as a high voltage device.

FIG. 7 illustrates a cross-sectional view of one embodiment of a vertical-drain NMOS (VDNMOS).transistor such as the one used to implement high voltage device 104 in FIG. 4. As shown in FIG. 7, an N-well 404 is formed on a P-substrate 402, and shallow trench isolation (STI) regions 416 are formed to provide isolation of various regions formed in the P-substrate 402. The N-well 404 may be formed in the P-substrate 402 through ion implantation and/or diffusion of dopant(s) having the N-type conductivity, which is opposite that of the substrate 402. The STI regions 416 may be formed in the N-well 404 through chemical etching and filling therein with an insulation material, such as oxide. A gate electrode 410 is formed on an upper portion of the N-well 404 and the P-substrate 402, and may be formed by depositing a N-type polysilicon layer on the upper portions of the N-well 404 and the P-substrate 402. Diffusion regions 406 and 408 are formed in the N-well 420 and in the P-substrate 402 at portions near the edge of the gate electrode 410 to serve as drain and source regions, respectively. Such diffusion regions 406 and 408 may be heavily doped with N+dopant(s) to improve contact resistance between a metal layer which forms metal lines 420 and 418. A gate oxide layer 412 is disposed underneath the gate electrode 410. The gate oxide layer 412 may exhibit a thickness of approximately 20–30 Ang. to offer enhanced programming capability. An insulation layer 414 is deposited on the substrate 402. Such an insulation layer 414 may be silicon oxide deposited over the entire surface of the substrate 402, or "grown" using, for example, a rapid thermal processing (RTP) tool. Alternatively, the insulation layer 414 may be silicon nitride or other insulation material that is either grown or deposited on the entire surface of the substrate 402.

Figure 9:
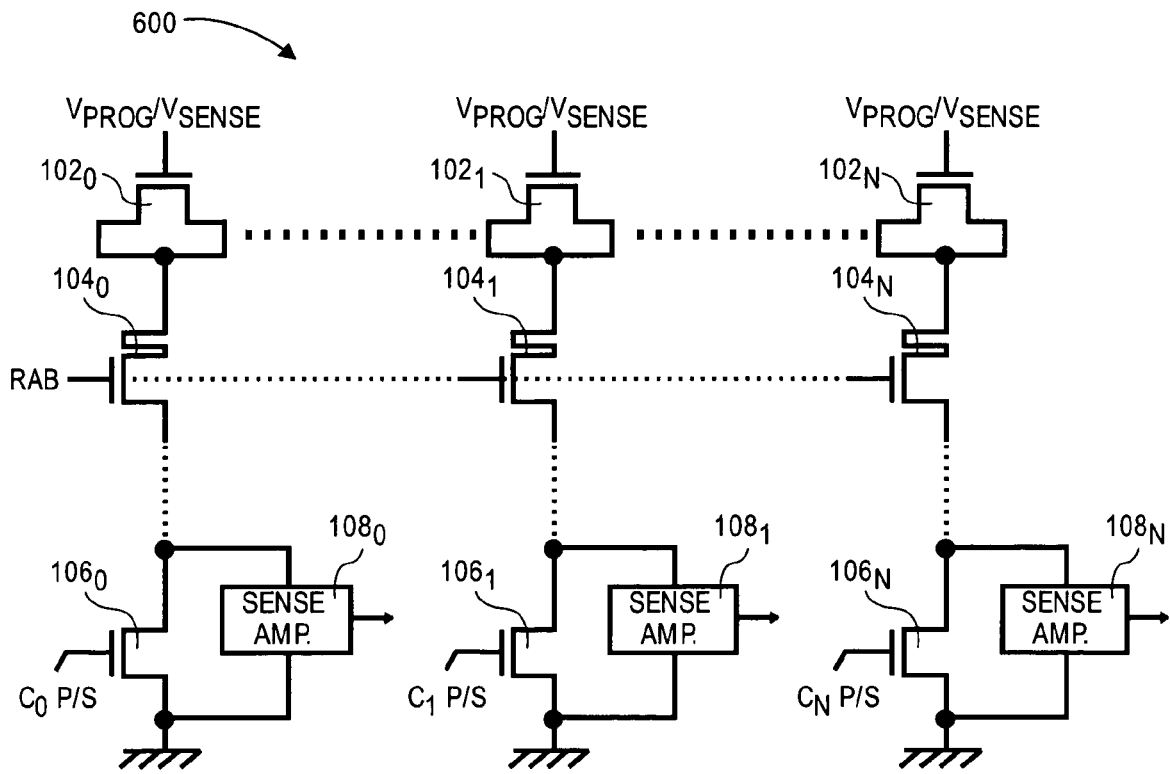
FIG. 9 shows a memory array with a plurality of OTP antifuse cells.

With reference to FIG. 9, an OTP antifuse array 600 according to one embodiment of the present invention is depicted. (It should be noted that only one row of antifuse cells is represented.) The depicted row includes antifuse elements, $102_0$–$102_N$, high voltage devices, $104_0$–$104_N$, program/sense transistors, $106_0$–$106_N$, and sense amplifiers, $108_0$–$108_N$. As shown in the drawing, the individual cells are configured and operate like antifuse cell 100 of FIG. 4, except that only one sense circuit (program/sense transistor and sense amplifier) is used for each column. The high voltage device control inputs for the entire row are coupled together and coupled to a RAB (row access/block) select signal for activating the row of high voltage devices when asserted. The other cells (not depicted) for each column need only an antifuse element and a high voltage device with the high voltage devices in each column all coupled to a common sense circuit. A separate $C_iP/S$ (column program/sense) select signal is applied to the gate of the program/sense transistor 106$i$ for each column. In operation, the RAB signal functions as a row select signal during sensing and programming to enable a particular row of cells, while the $C_iP/S$ signal functions as a column select signal to enable sensing and programming for a particular column. By asserting these signals for an appropriate row and column, any antifuse element within the entire array can be separately programmed or sensed. On the other hand, if desired, antifuse elements in different columns can be simultaneously programmed or sensed with the depicted configuration by asserting multiple $C_iP/S$ signals.

It should be appreciated that the present invention is applicable for use with all types of semiconductor integrated circuit ("IC") chips that may be fabricated using complementary metal-oxide semiconductor ("CMOS") technology. Examples of these IC chips include but are not limited to processors, controllers, chip set components, programmable logic arrays (PLA), and memory chips.

While the inventive disclosure has been described in terms of several embodiments, those skilled in the art will recognize that the invention is not limited to the embodiments described, but can be practiced with modification and alteration within the spirit and scope of the appended claims. For example, while an antifuse cell having just two (on/off) sates is primarily discussed, an antifuse element, as disclosed herein, could be used to represent one of multiple (more than two) states. The antifuse element's resistance could be progressively reduced a desired amount to come within one of a multiplicity of predefined value ranges corresponding to a multiplicity of states. Its resistance could then be measured to determine its particular programmed state.

Moreover, it should be appreciated that example sizes/models/values/ranges may have been given, although the present invention is not limited to the same. As manufacturing techniques (e.g., photolithography) mature over time, it is expected that devices of smaller size could be manufactured. With regard to description of any timing or programming signals, the terms "assertion" and "negation" are used in an intended generic sense. More particularly, such terms are used to avoid confusion when working with a mixture of "active-low" and "active-high" signals, and to represent the fact that the invention is not limited to the illustrated/described signals, but can be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. In addition, well known power/ground connections to IC chips and other components may or may not be shown within the figures for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of programming a memory array, comprising:
   accessing a plurality of word lines of the memory array by providing a plurality of voltage steps sequentially after one another to the respective word lines; and
   accessing a plurality of bit lines of the memory array each time that a respective word line is accessed, to program a plurality of devices corresponding to individual word and bit lines that are simultaneously accessed, each device being programmed by breaking a dielectric layer of the device, accessing of the bit lines being sequenced such that only a single one of the devices is programmed at a time.

2. The method of claim 1, wherein a word to be written is provided to the bit lines, further comprising masking all except one of the bit lines at a time.

3. The method of claim 2, wherein bits of words to be written through the bit lines are masked.

4. The method of claim 3, wherein the bits from individual bits of a shift register mask are combined with individual bits from a data register to mask the bit lines.

5. The method of claim 4, wherein only a single bit of the shift register mask is set to "one" at a time, and the data from the individual bits of the shift register mask and the individual bits of the data register are combined with a plurality of respective AND gates.

6. The method of claim 1, wherein each voltage step has a voltage of at least 2V.

7. The method of claim 1, wherein each device is a PMOS transistor.

8. An apparatus for programming a memory array, comprising:
   a word line driver that accesses a plurality of word lines of the memory array by providing a plurality of voltage steps sequentially after one another to the respective word lines; and
   a bit line programmer that accesses a plurality of bit lines each time that a respective word line is accessed, to program a plurality of devices corresponding to individual word and bit lines that are simultaneously accessed, each device being programmed by breaking a dielectric layer of the device, accessing of the bit lines being sequenced such that only a single one of the devices is programmed at a time.

9. The apparatus of claim 8, wherein the bit line programmer includes a data register holding individual bits of a respective word, and a shift register mask holding shift register bits, the bits of the data register and shift register mask being combined to access the bit lines.

10. The apparatus of claim 9, wherein only one bit of the bits of the shift register mask is set to "one," the respective bit that is set to "one" being sequenced through the shift register mask, further comprising a plurality of AND gates, each combining a respective bit from the data register and a respective bit from a shift register mask and providing an output to a respective one of the bit lines.

11. An apparatus for programming a memory array, comprising
    a low voltage source;
    a high voltage source;
    a plurality of word line switches, each being switchable between the high voltage source and the low voltage source;
    a word line driver that switches each one of the word line switches such that only one of the word line switches is connected to the high voltage source at a particular moment in time;
    a data register holding a plurality of bits forming a word to be programmed, the bits of the data register being replaced together with switching of the word line switches;
    a shift register mask holding a plurality of bits, only one of the bits of the shift register mask being set to "one," the bit that is set to "one" being sequenced though the shift register mask when the data register holds each respective word; and
    a plurality of AND gates, each combining a respective bit of the data register and a respective bit of the shift register mask, and providing outputs to a bit line driver such that only a single bit of the bit line driver is set to "one" at a particular moment in time.

12. The apparatus of claim 11, further comprising a plurality of bit line switches, each being switched in response to a bit held by the bit line driver.

13. The apparatus of claim 12, further comprising a plurality of bit line switches, each being switchable between the low voltage source and ground, the switches switching to ground when the bit line driver is set to "one," and to the low voltage source when the bit line driver is set to "zero."

14. The apparatus of claim 13, wherein each one of the word line switches is switchable to ground.

15. The apparatus of claim 11, wherein the high voltage source is at least 2V.

* * * * *